United States Patent [19]

Sakamoto et al.

[11] Patent Number: 5,234,781
[45] Date of Patent: Aug. 10, 1993

[54] MASK FOR LITHOGRAPHIC PATTERNING AND A METHOD OF MANUFACTURING THE SAME

[75] Inventors: Kiichi Sakamoto, Tokyo; Hiroshi Yasuda, Yokohama, both of Japan

[73] Assignee: Fujitsu Limited, Kawasaki, Japan

[21] Appl. No.: 877,396

[22] Filed: Apr. 30, 1992

Related U.S. Application Data

[63] Continuation of Ser. No. 429,499, Oct. 31, 1989, abandoned.

[30] Foreign Application Priority Data

Nov. 7, 1988 [JP] Japan .................. 63-280671

[51] Int. Cl.$^5$ .................................. G03F 9/00
[52] U.S. Cl. ............................. 430/5; 430/311; 430/313; 156/645; 378/35
[58] Field of Search ............. 430/5, 311, 313; 156/645; 378/35

[56] References Cited

U.S. PATENT DOCUMENTS

| | | | |
|---|---|---|---|
| 3,713,922 | 1/1973 | Lepsetler et al. | 430/5 |
| 4,256,532 | 3/1981 | Magdo et al. | 428/134 |
| 4,260,670 | 4/1981 | Burns | 430/5 |
| 4,448,865 | 5/1984 | Bohlen et al. | 430/5 |
| 4,680,243 | 7/1987 | Shimkunas et al. | 378/35 |
| 4,751,169 | 6/1988 | Behringer et al. | 430/5 |
| 4,855,197 | 8/1989 | Zapka et al. | 430/5 |
| 4,897,360 | 1/1990 | Guckel et al. | 437/7 |
| 5,005,075 | 4/1991 | Kobayashi et al. | 430/5 |
| 5,051,326 | 9/1991 | Celler et al. | 378/35 |

FOREIGN PATENT DOCUMENTS

| | | | |
|---|---|---|---|
| 0001038 | 3/1979 | European Pat. Off. | |
| 0019779 | 12/1980 | European Pat. Off. | |
| 0019779 | 12/1980 | European Pat. Off. | |
| 0212713 | 3/1987 | European Pat. Off. | |
| 0368089 | 5/1990 | European Pat. Off. | 430/5 |
| 2316635 | 1/1977 | France | |
| 2-126630 | 5/1990 | Japan | 430/5 |
| 8906045 | 6/1989 | World Int. Prop. O. | |

*Primary Examiner*—Charles L. Bower, Jr.
*Assistant Examiner*—Thomas R. Neville
*Attorney, Agent, or Firm*—Staas & Halsey

[57] ABSTRACT

A mask for lithographic patterning comprises a base body provided with a through hole passing from a top side to a bottom side thereof, a mask layer provided on the top side of the base body so as to close the through hole, the mask layer being defined by a substantially flat top surface and a substantially flat bottom surface and having a thickness ranging from about 2 $\mu$m to about 20 $\mu$m, and a plurality of patterned apertures provided on the mask layer at a part closing the through hole.

8 Claims, 5 Drawing Sheets

MASK FOR LITHOGRAPHIC PATTERNING AND A METHOD OF MANUFACTURING THE SAME

This application is a continuation of application Ser. No. 07/429,499 filed Oct. 31, 1989, now abandoned.

BACKGROUND OF THE INVENTION

The present invention generally relates to lithographic patterning of a semiconductor substrate and more particularly to a mask for lithographic patterning of a semiconductor substrate and a method of manufacturing the same.

With continuous demand to increase the integration density of integrated circuits, new lithography techniques such as electron beam lithography or X-ray beam lithography are now under intensive study. According to such a new lithography technique, a fine patterning with a pattern size of 1 μm or less can be achieved easily.

In the electron beam lithography, a mask having an aperture for passing an electron beam according to a predetermined pattern is used for shaping the electron beam. In using such a mask, it is required that the mask is manufactured easily with high precision. Further, a mask is required that it can be used repeatedly.

FIG. 1 shows a typical prior art mask used for electron beam lithography as viewed from a bottom side thereof. Referring to the drawing, the mask comprises a base body 1 of silicon and there are provided a plurality of pattern regions 2 such as the regions 2a–2f each having a size of about 300×300 μm. In the pattern regions 2, a plurality of apertures 3a–3f are formed respectively according to desired beam shapes. Further, there are provided a plurality of reinforcement ribs 4a–4c on the base body 1 so as to surround the pattern regions 2a–2f to provide a rigidity thereto. The pattern regions 2a–2f generally have an extremely small thickness in the order of 1 μm or less because of the reason to be described and because of this, the pattern regions have to be reinforced by the reinforcement ribs 4a–4c.

In such a prior art mask, however, use of the reinforcement ribs decreases the number of the pattern regions which can be provided on the mask. Further, such a rib makes the manufacturing of the mask extremely difficult or even unrealistic. In other words, the mask with a structure as shown in FIG. 1 is virtually impossible to construct with reliability for practical use. When the ribs are omitted, on the other hand, the number of pattern regions on the mask is reduced to only one and the efficiency of the patterning process is significantly reduced as the mask has to be replaced each time the pattern to be written on the substrate is changed. Note that one pattern region can carry only one pattern, if not provided with such reinforcement, because of the reduced size of the pattern region.

In such a prior art mask, there is a further problem in that the thin mask region, being irradiated by the high energy electron beam, tends to be heated. When such heating occurs, the mask region is easily deformed and the pattern transferred on the semiconductor substrate is deformed. It is needless to mention the difficulty in handling such a fragile mask. Further, because of the reduced thickness of the pattern regions, some of the electron beams are passed through the pattern regions with substantial scattering, and thus there arises another problem in which the contour of the image transferred on the semiconductor substrate is blurred.

Conventionally, the mask shown in FIG. 1 is formed by a series of doping and etching processes as shown in FIGS. 2(A)–(D). In these drawings, the reinforcement ribs are omitted for the sake of simplicity.

Referring to FIG. 2(A), a silicon base body 1 is prepared with a thickness of about 500 μm such that the base body has a (100) top surface 1a and a (100) bottom surface 1b. In a next step of FIG. 2(B), the top surface 1a is doped with boron by ion implantation and a boron-doped region 1c is formed. As the region 1c is formed by the ion implantation, the thickness of the region 1c is very thin in the order of a few hundred nanometers in the maximum, typically about 0.2 μm. Next, the bottom surface 1b of the base body 1 is etched in a solution of potassium hydroxide (KOH) whereby a (111) plane of silicon is preferentially etched and a space 5 as shown in FIG. 2(C) is formed. Note that the etching of silicon by KOH is stopped at the boron-doped region 1c because of the reduced etching rate. Further, the boron-doped region 1c is patterned and a structure shown in FIG. 2(D) is obtained.

It will now be understood the reason why the thickness of the pattern region 2 has been so small in the prior art mask. Associated with the formation of the region 1c by doping, there arises another problem in that the lower boundary of the boron-doped region 1c is not flat. In other words, there is some undulation in the lower boundary of the region 1c as shown in FIG. 2(E). Such an undulation of the doped region is usually negligible in the manufacturing of integrated circuits as the lateral extent of such a doped region in the semiconductor device is uncomparably small. In the case of the mask, however, the lateral extent of such a region is in the order of several hundred microns to several millimeters and thus the pattern region 2 can have a substantial variation in the thickness. Such a variation can provide a substantial effect on the patterning process such as a change in the focusing of the electron beam on the semiconductor substrate.

Further, associated with the undulation of the lower boundary of the doped region 1c, there arises a still other problem in that the size of the aperture formed in a part of the pattern region 2 having a reduced thickness tends to be enlarged as compared to the apertures in a thick part because of the excessive etching.

SUMMARY OF THE INVENTION

Accordingly, it is a general object of the present invention to provide a novel and useful mask for lithographic patterning of a semiconductor substrate wherein the foregoing problems are eliminated.

Another and more specific object of the present invention is to provide a mask for lithographic patterning of a semiconductor substrate having an excellent dimensional precision and for allowing a repeated use.

Another object of the present invention is to provide a mask for lithographic patterning of a semiconductor substrate which can be manufactured easily.

Another object of the present invention is to provide a mask for lithographic patterning of a semiconductor substrate comprising a base body and a mask layer provided on the base body with one or a plurality of apertures, wherein the mask layer has a thickness of about 2–20 μm. According to the present invention, a large number of patterns can be provided on the mask layer in the form of aperture and the lithographic patterning process is facilitated. Further, as a result of the relatively large thickness of the mask layer carrying the patterns, the mask is solid and can be handled easily or used repeatedly. Furthermore, as a result of the relatively large thickness of the mask layer, the transmission of charged particles, such as electrons, for the lithographic patterning through the mask is eliminated and the image formed on the substrate is sharply defined. Further, the problem of deformation of the mask by local heating caused by the irradiation of the charged particle beam is successfully eliminated by increasing the thickness of the mask layer.

Another object of the present invention is to provide a method of manufacturing a mask for lithographic patterning of a semiconductor substrate, comprising steps of providing a silicon layer on a top surface of a base body which has a silicon oxide layer at least on said top surface, removing a part of the silicon layer to form a mask layer of silicon having a reduced thickness, patterning the mask layer according to a predetermined pattern by etching to form a mask region in which said predetermined pattern is formed, and removing a part of the base body located at least under the mask region by applying etching which proceeds from a bottom side of the base body and reaches the mask layer. According to the present invention, the mask can be formed easily with high precision. Note that the thickness of the mask layer in which the predetermined pattern is formed as apertures is uniform as the thickness of the silicon layer is reduced uniformly by lapping and the like. By applying a well established lapping process using a diamond paste and the like, a satisfactorily flat surface can be obtained. As the mask layer is formed by reducing the thickness of the silicon layer, a relatively large thickness in the order of a few microns to about 20 microns can be obtained easily and with reliability. As a result of use of the mask having a mask layer with relatively large thickness, the foregoing various advantages are achieved.

Other objects and further features of the present invention will become apparent from the following detailed description when read in conjunction with attached drawings.

DESCRIPTION OF THE PREFERRED EMBODIMENTS

Figure 1:
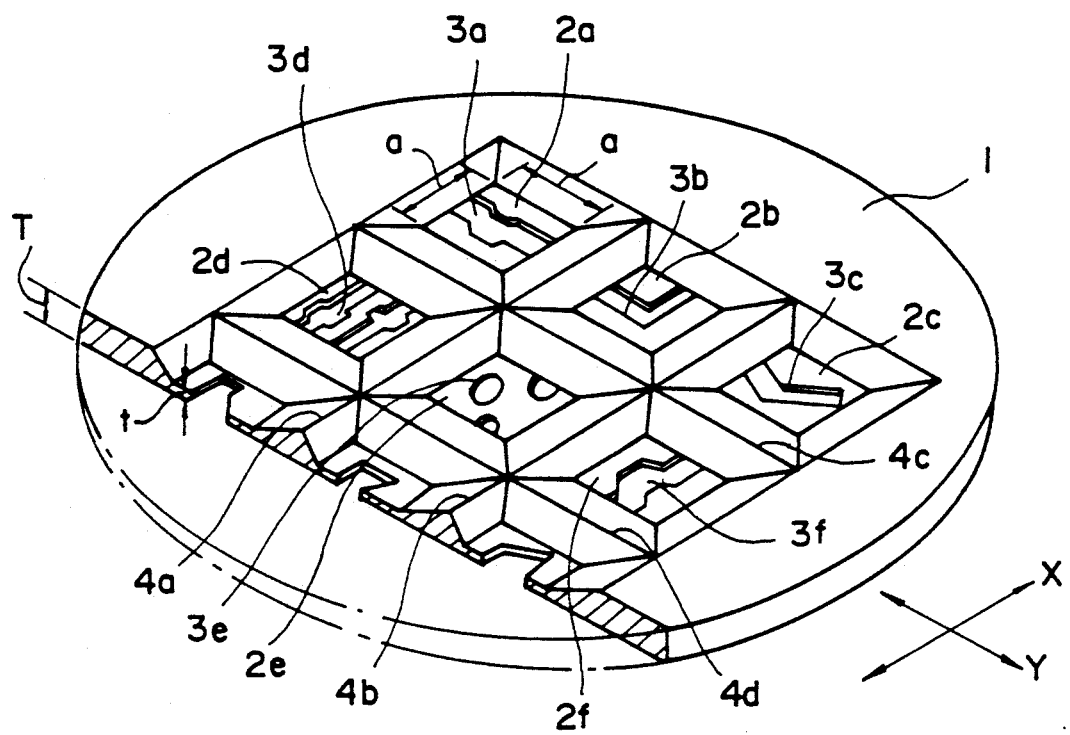
FIG. 1 is a perspective view showing bottom side of a prior art mask.
Figure 2A:
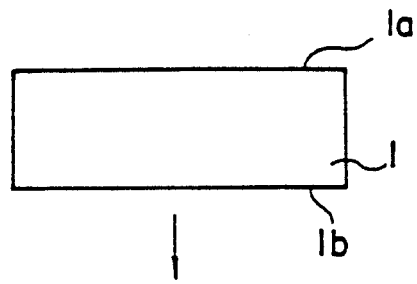
FIGS. 2(A)-(E) are diagrams showing a manufacturing process of the mask of FIG. 1 and a problem thereof.
Figure 2B:
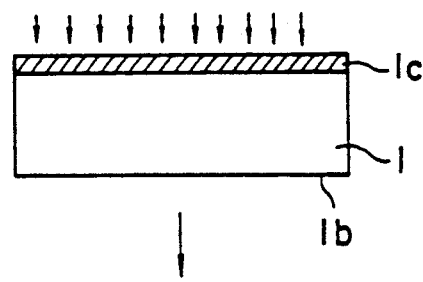
Figure 2C:
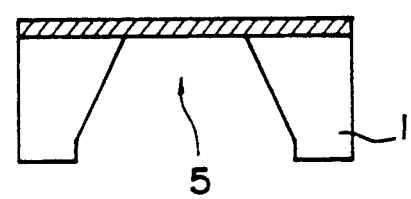
Figure 2D:
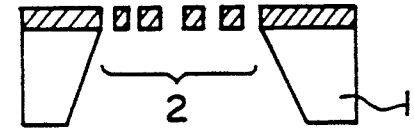
Figure 2E:
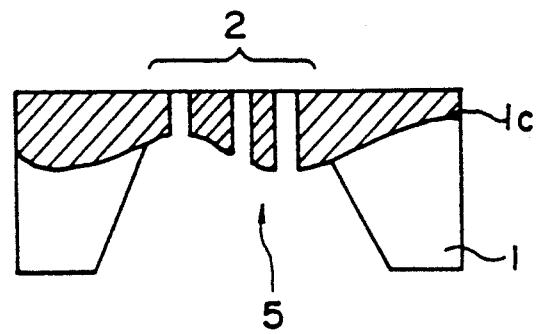
Figure 3A:
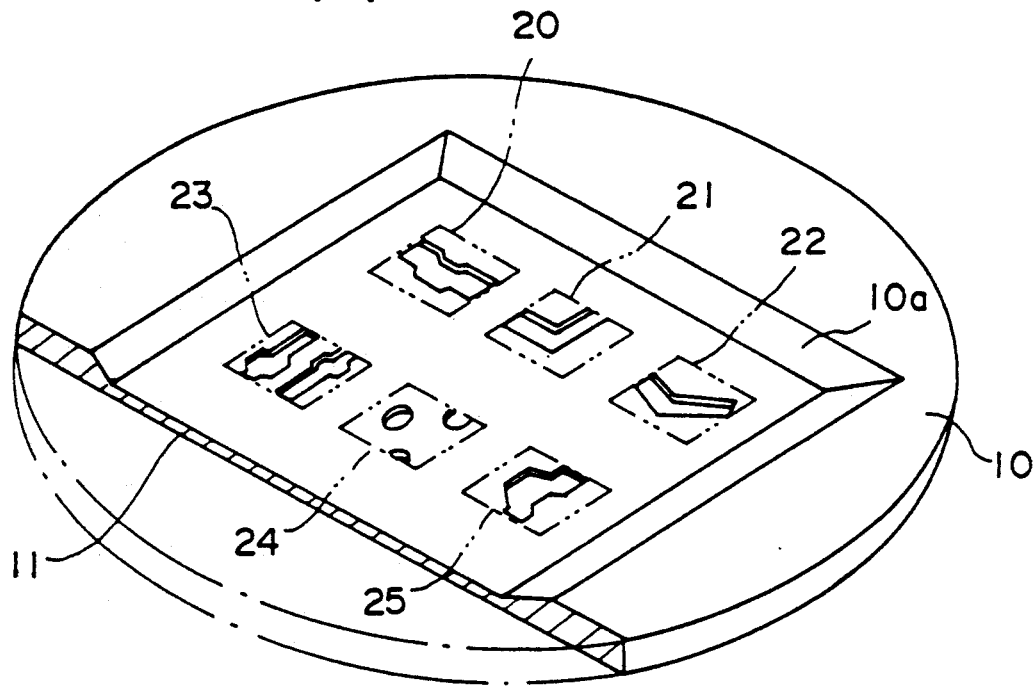
FIGS. 3(A) and (B) are respectively a perspective view showing a bottom side of a mask according to a first embodiment of the present invention and a cross sectional view thereof.
Figure 3B:
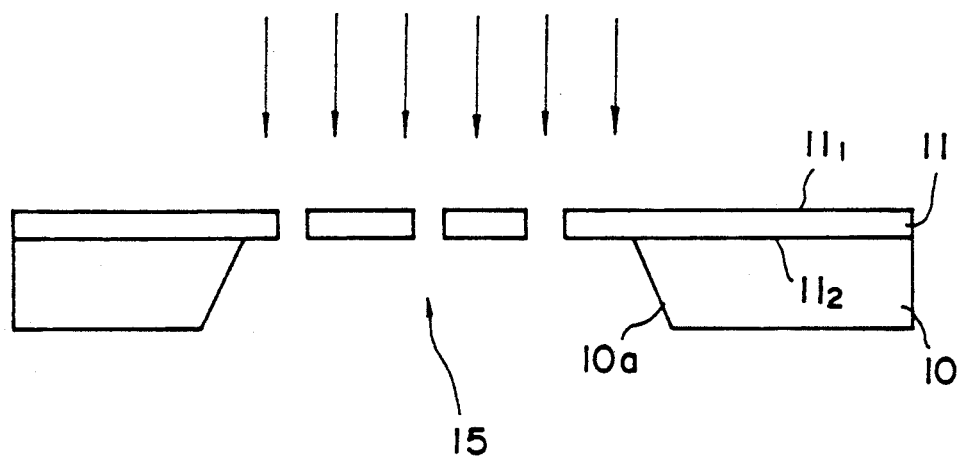

FIG. 3(A) is a perspective view showing a bottom side of the mask according to a first embodiment of the present invention and FIG. 3(B) is a cross sectional view thereof. Referring to FIG. 3(A), the mask comprises a generally circular base body 10 of a silica or silicate glass on which a mask layer 11 of silicon is provided. As can be seen in the cross sectional view of FIG. 3(B), the base body 10 is provided with a large cutout or through hole 15 defined by an inner wall 10a, and the through hole 15 is closed by the mask layer 11 at the top of the base body 10 having a flat top surface $11_1$ and a flat bottom surface $11_2$. In one example, the cutout 15 has a size of about 40 mm×40 mm.

On the mask layer 11, there are provided a plurality of patterning apertures 20-25 as shown in FIG. 3(A) in correspondence to the through hole 15. The mask layer 11 typically has a thickness of about 2 $\mu$m to 20 $\mu$m and thus has a substantial rigidity. In other words, the mask layer 11 can extend over the through hole 15 without reinforcement in contrast to the prior art mask, in which the pattern region 2 corresponding to the mask layer 11 is extremely fragile and needed the reinforcement by the ribs 4a-4d. Each of the apertures 20-25 has a size of typically about 300 $\mu$m×300 $\mu$m and thus about 200 patterning apertures can be provided on a part of the mask layer 11 having a size of about 5×5 mm which is a typical size of an area which can be addressed by deflection of an electron beam without moving the mask. Note that the size of the apertures is exaggerated in FIG. 3.

In the mask of the present invention, because of the substantial thickness and rigidity of the mask layer 11, a large number of patterning apertures can be provided on the mask layer 11. As a result, the patterning process can be carried out efficiently as the step of moving or replacing the mask during the exposure can be eliminated. Further, the deformation of the mask layer 11 associated with the heating by the electron beam can be eliminated because of the increased rigidity of the mask layer 11. At the same time, the handling of the mask becomes easier and the mask can be used repeatedly for a number of times. Further, the passing-through of the electron beam through the mask layer 11 for a part not provided with the patterning aperture is positively prevented by the increased thickness of the mask layer 11 and a sharp image can be formed on a semiconductor wafer (not shown) to be patterned. Furthermore, the mask is easily manufactured by a simple process.

Next, manufacturing process of the mask of FIGS. 3(A) and (B) will be described with reference to FIGS. 4(A)-(E).

Figure 4A:
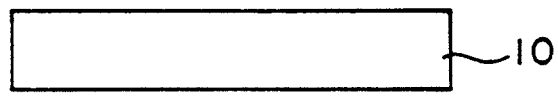
FIGS. 4(A)-(E) are diagrams showing various steps for manufacturing the mask of FIG. 3(A)
Figure 4B:
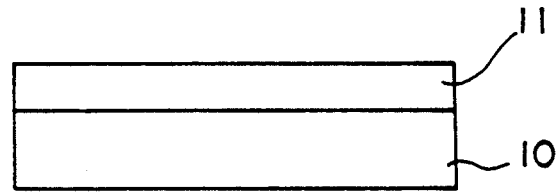

In a step of FIG. 4(A), the base body 10 of a silica glass disk is prepared with a typical diameter of about several centimeters and a typical thickness of about 500 $\mu$m. Next, in a step of FIG. 4(B), a silicon substrate 11a having a corresponding circular shape and a thickness of several hundred microns is joined on a surface of the base body 10. The joining of the base body 10 and the silicon substrate 11a is performed at a temperature of 900° to 1000° C. while contacting the base body 10 and the substrate 11a, wherein the silicon substrate 11a is welded to the base body 10 via a thin oxide film (not shown) formed on the surface of the silicon substrate.

Figure 4C:
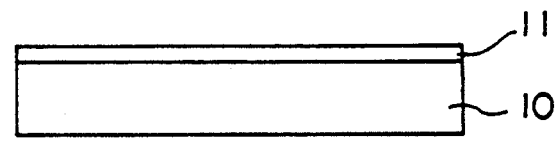
Figure 4D:
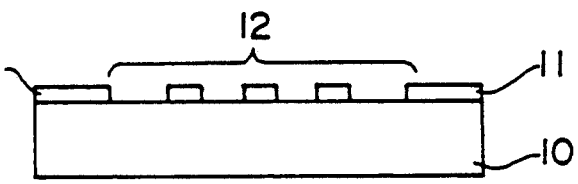

Next, the thickness of the silicon substrate 11a is reduced as shown in FIG. 4(C) by lapping using a diamond paste or other suitable abrasives until the mask layer 11 has a desired thickness which is generally less than about 20 $\mu$m but larger than about 2 $\mu$m. When the thickness is larger than about 20 $\mu$m, the dimensional precision of the pattern transferred to the semiconductor wafer is deteriorated because of the change in the focusing of the electron beam. In a step of FIG. 4(D), the entire surface of the mask layer 11 is covered by a photoresist (not shown) and after suitable patterning of the photoresist, a mask pattern 12 comprising a number of patterned apertures shown in FIG. 3(A) is formed as a result of etching. After removal of the photoresist, a structure shown in FIG. 4(D) is obtained.

Figure 4E:
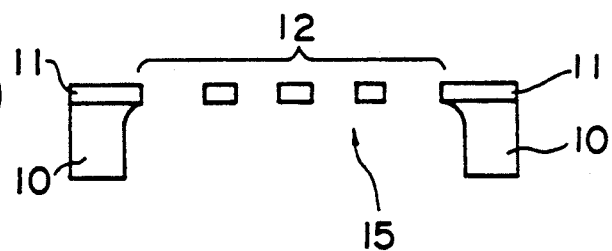

Next, in a step of FIG. 4(E), a part of the base body 10 located below the mask pattern 12 is removed by etching which may be a wet etching using a solution of hydrofluoric acid (HF) and there is provided a path of electron beam through the mask layer 11 according to the predetermined apertures.

According to the foregoing process, the thickness of the mask layer 11 is controlled by well established lapping process. According to the currently available technique, a thickness of about 2 μm or more is achieved with reliability. Note that the thickness below about 2 μm is undesirable for the mask layer 11 because of the reduced rigidity which tends to cause various problems associated with the prior art mask. When the thickness of the mask layer 11 is increased beyond about 20 μm, on the other hand, the foregoing deterioration in the accuracy of focusing is caused because of the too large thickness of the mask layer.

In the present invention, by applying the well established lapping process, the mask layer 11 has a uniform and exactly controlled thickness in the foregoing range of about 2 μm to 20 μm, and the unwanted variation of the size of the apertures 20-25, which is caused as a result of the excessive or insufficient etching which in turn is caused as a result of the non-uniform thickness of the mask layer 11, is positively eliminated.

Next, a second embodiment of the mask of the present invention and a manufacturing process thereof will be described with reference to FIGS. 5(A)-(E). As the perspective view of this mask is substantially identical to that of the mask of the first embodiment, the illustration of the perspective view will be omitted. Further, those parts already described with the preceding drawings are given identical reference numerals and the description thereof will be omitted.

Figure 5A:
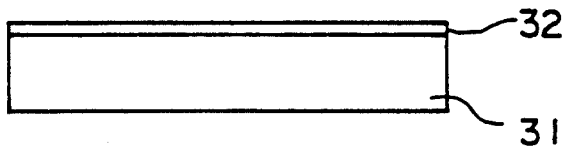
FIGS. 5(A)-(E) are diagrams similar to FIGS. 4(A)-(E) showing various steps for manufacturing the mask according to a second embodiment of the present invention.

In the first step, a silicon substrate 31 having a (100) top surface is subjected to thermal oxidation whereby the base body 10 is formed as the silicon substrate 31 having a thin surface oxide layer 32 on the top surface as shown in FIG. 5(A). Preferably, the oxide layer 32 has a thickness of about 1 μm or less, although such a limitation in the thickness is not absolutely necessary.

Figure 5B:
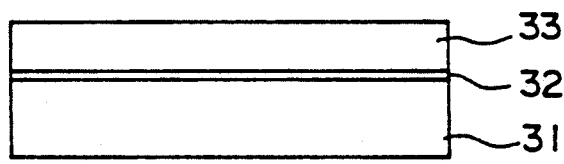
Figure 5C:
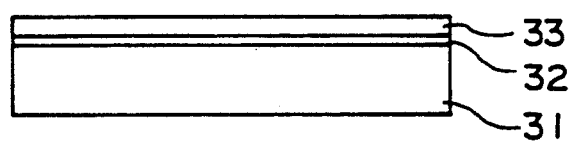

In a step of FIG. 5(B), another silicon substrate 33 is contacted with the surface oxide layer 32, and after an annealing in a temperature range between 900° C. and 1000° C., the silicon substrate 33 is welded to the silicon substrate 32 via the surface oxide layer 32. Thus, a structure in which the surface oxide layer 32 is sandwiched between the silicon substrate 31 and the silicon substrate 33 is obtained.

Figure 5D:
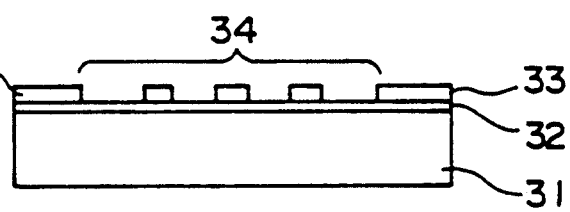

Next, the silicon substrate 33 at the top of the structure of FIG. 5(B) is subjected to lapping about 20 μm or less but larger than about 2 μm. Further, a photoresist (not shown) is provided on the entire surface of the substrate 33 and after a suitable patterning for defining a desirably patterned apertures to be formed on the mask, the silicon substrate 33 is subjected to etching similarly to the foregoing embodiment. As a result of the etching, a structure shown in FIG. 5(D) is formed in which the foregoing apertures 20-25 are formed on a mask region 34 in the substrate 33.

Further, the silicon substrate 31 is subjected to anisotropic etching by a KOH solution wherein the (111) plane of silicon in the substrate 31 is preferentially etched. For this purpose, the entire structure of FIG. 5(D) is covered except for an etching window (not shown) at a bottom side of the substrate 31. In a case where the substrate 31 has a thickness of 500 μm and where the mask region 34 has a desired size of 500 μm × 500 μm, an etching window having a size of about 1200 μm × 1200 μm is required.

When the etching has reached the silicon oxide layer 32, the etching rate is decreased and the etching is stopped. Thereafter, the silicon oxide layer 32 below the mask region 34 is removed by etching using HF. As a result, a space 35 is formed in the base body 31 in correspondence to the mask region 34 and a mask having a structure as shown in FIG. 5(E) is obtained.

Figure 5E:
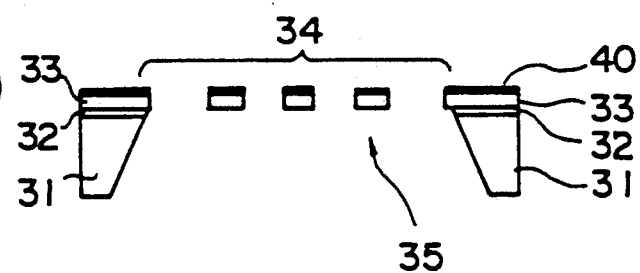

In any of the foregoing embodiments, a metal layer 40 of tantalum and the like may be provided on the silicon substrate 11 or 33 as shown in FIG. 5(E), for example, for dissipating heat produced at the time the electron beam is irradiated.

The mask of the present invention is useful particularly in the electron beam lithography system for providing a desired cross section to the electron beam. However, the present invention is not limited as such but the mask is applicable also in other charged particle beam lithography system in general.

Further, the present invention is not limited to these embodiments described heretofore but various variations and modifications may be made without departing from the scope of the invention.

What is claimed is:

1. A method of manufacturing a mask for electron beam lithographic patterning, comprising the steps of:
    joining a lower major surface of a silicon substrate having upper and lower major surfaces to a top side of a silicon oxide base body;
    reducing a thickness of said silicon substrate joined to said base body by polishing said upper major surface of said silicon substrate such that said silicon substrate has a reduced and uniform thickness which is smaller than about 20 μm but is large enough for interrupting an electron beam;
    patterning said silicon substrate to from a mask pattern region in said silicon substrate by forming apertures in said mask pattern region to define a plurality of mask patterns; and
    etching said base body such that a part of said base body located under said mask pattern region is removed, said step of etching being continued until portions of said lower major surface of said silicon substrate that are in said mask pattern region and that surround said apertures are completely exposed.

2. A method as claimed in claim 1 in which each of said mask patterns has a size of at least about 300 μm × 300 μm.

3. A method as claimed in claim 1 in which said step of joining said lower major surface of said silicon substrate to the top side of said base body comprises a step of annealing said silicon substrate and said base body at a temperature between 900° C. and 1000° C. in a state that said silicon substrate and said base body are contacting each other.

4. A method as claimed in claim 1 further comprising a step of depositing a metal layer on the silicon substrate after the step of patterning.

5. A method of manufacturing a mask for electron beam lithographic patterning, comprising the steps of:
    joining a lower major surface of a silicon substrate having upper and lower major surfaces to an upper major surface of a base body having upper and lower major surfaces, said base body comprising a silicon oxide layer having upper and lower major surfaces and a base part having upper and lower major surfaces, said upper major surface of said base part being in contact with said lower major surface of said silicon oxide layer, said upper major surface of said silicon oxide layer being coincident with said upper major surface of said base body, and said lower major surface of said base part being coincident with said lower major surface of said base body;

reducing a thickness of said silicon substrate joined to said base body by polishing said upper major surface of said silicon substrate such that said silicon substrate has a reduced and uniform thickness which is smaller than about 20 μm but is large enough for interrupting an electron beam;

patterning said silicon substrate to form a mask pattern region in said silicon substrate by forming apertures in said mask pattern region to define a plurality of mask patterns; and etching said base body such that a part of said base body located under said mask pattern region is removed, said step of etching including a first step of etching said base body starting from said lower major surface of said base part to expose said lower major surface of said silicon oxide layer and a second step of selectively etching said silicon oxide layer starting from said exposed lower major surface of said silicon oxide layer until portions of said lower major surface of said silicon substrate that are in said mask pattern region and that surround said apertures are completely exposed.

6. A method as claimed in claim 5 in which said second step of selectively etching comprises a step of isotropic etching using a fluoride etching agent.

7. A method as claimed in claim 5 in which said base part comprises a silicon body carrying said silicon oxide layer, and said step of joining said silicon substrate further comprises a step of providing said silicon oxide layer by thermal oxidation of said silicon body.

8. A method as claimed in claim 7 in which said first step of etching comprises an anisotropic etching of the silicon body using a solution of potassium hydroxide and said second step of selectively etching comprises an isotropic etching of the silicon oxide layer by a fluoride etching agent.

* * * * *

UNITED STATES PATENT AND TRADEMARK OFFICE
CERTIFICATE OF CORRECTION

PATENT NO. : 5,234,781
DATED      : August 10, 1993
INVENTOR(S): Kiichi SAKAMOTO et al.

It is certified that error appears in the above-identified patent and that said Letters Patent is hereby corrected as shown below:

Title Page, Section [56], FOREIGN PATENT DOCUMENTS, delete line 3 in its entirety (duplicate entry).

Column 5, line 55, after "lapping" insert --whereby the thickness of the substrate 33 is reduced to--.

Column 6, line 24, change "system" to --systems--; and
line 41, change "from" to --form--.

Signed and Sealed this

Twentieth Day of September, 1994

Attest:

BRUCE LEHMAN

Attesting Officer

Commissioner of Patents and Trademarks